United States Patent
Ahmad

(10) Patent No.: US 8,803,662 B2
(45) Date of Patent: *Aug. 12, 2014

(54) REMOTE MONITORING AND CONTROL OF LED BASED STREET LIGHTS

(75) Inventor: Rizwan Ahmad, Summit, NJ (US)

(73) Assignee: Dialight Corporation, Farmingdale, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 12/984,377

(22) Filed: Jan. 4, 2011

(65) Prior Publication Data

US 2011/0095867 A1 Apr. 28, 2011

Related U.S. Application Data

(63) Continuation-in-part of application No. 12/431,326, filed on Apr. 28, 2009.

(51) Int. Cl.
| | |
|---|---|
| H04Q 5/22 | (2006.01) |
| G01R 31/00 | (2006.01) |
| H04Q 9/00 | (2006.01) |
| G01D 4/00 | (2006.01) |
| G01R 31/44 | (2006.01) |

(52) U.S. Cl.
CPC .................. *H04Q 9/00* (2013.01); *Y02B 90/242* (2013.01); *Y04S 20/42* (2013.01); *Y02B 90/246* (2013.01); *G01R 31/44* (2013.01); *Y04S 20/322* (2013.01); *H04Q 2209/25* (2013.01); *G01D 4/004* (2013.01)
USPC ...................... 340/10.1; 340/10.5; 340/815.45

(58) Field of Classification Search
USPC ............. 40/557; 315/129, 312; 324/110, 414; 340/10.1–10.52, 310.11, 635, 815.45, 340/906–907, 909, 915, 924, 944, 340/FOR. 465; 346/14 MR; 362/311.02
See application file for complete search history.

(56) References Cited

U.S. PATENT DOCUMENTS

| | | | |
|---|---|---|---|
| 3,944,723 | A | 3/1976 | Fong |
| 4,580,099 | A | 4/1986 | Zetti |
| 4,924,151 | A | 5/1990 | D'Aleo et al. |
| 5,095,502 | A | 3/1992 | Finzel |
| 5,471,201 | A | 11/1995 | Cerami et al. |

(Continued)

FOREIGN PATENT DOCUMENTS

| | | |
|---|---|---|
| JP | 10-234142 A | 9/1998 |
| WO | WO 2009/124453 A1 | 10/2009 |
| WO | WO 2010/101370 A2 | 9/2010 |
| WO | WO 2010/125325 A1 | 11/2010 |

OTHER PUBLICATIONS

International Search Report and Written Opinion for PCT/GB2009/050437, Feb. 3, 2010, copy consists of 9 pages.

(Continued)

*Primary Examiner* — Benjamin C Lee
*Assistant Examiner* — Stephen Burgdorf

(57) ABSTRACT

The present invention is directed to a method for remotely collecting metering information via a light emitting diode (LED) based street light. In one embodiment, the method includes collecting information from a utility meter coupled to a home, establishing a two-way communication path via a communication module to a central office, wherein the communication module is coupled to the LED based street light and sending the information from the utility meter to the central office via the two-way communication path.

19 Claims, 8 Drawing Sheets

(56) References Cited

U.S. PATENT DOCUMENTS

| | | | |
|---|---|---|---|
| 5,811,975 A | 9/1998 | Bernardo | |
| 5,923,269 A | 7/1999 | Shuey et al. | |
| 5,962,991 A | 10/1999 | Levy | |
| 6,046,550 A | 4/2000 | Ference et al. | |
| 6,489,733 B1* | 12/2002 | Schmidt et al. | 315/312 |
| 7,471,051 B1 | 12/2008 | Wacknov et al. | |
| 7,546,168 B2 | 6/2009 | Walters et al. | |
| 7,769,149 B2* | 8/2010 | Berkman | 379/93.01 |
| 7,791,492 B2 | 9/2010 | Nam et al. | |
| 7,817,063 B2* | 10/2010 | Hawkins et al. | 340/870.07 |
| 7,825,793 B1* | 11/2010 | Spillman et al. | 340/539.1 |
| 7,889,094 B2* | 2/2011 | Gilbert et al. | 340/815.45 |
| 8,242,887 B2* | 8/2012 | Cornwall et al. | 340/9.14 |
| 8,598,986 B2* | 12/2013 | Ahmad | 340/10.1 |
| 2003/0041107 A1* | 2/2003 | Blattner et al. | 709/204 |
| 2004/0105264 A1* | 6/2004 | Spero | 362/276 |
| 2004/0189722 A1 | 9/2004 | Acres | |
| 2005/0174473 A1 | 8/2005 | Morgan et al. | |
| 2005/0238044 A1* | 10/2005 | Osterloh et al. | 370/460 |
| 2006/0023853 A1 | 2/2006 | Shelley et al. | |
| 2006/0044158 A1 | 3/2006 | Womble et al. | |
| 2006/0076908 A1 | 4/2006 | Morgan et al. | |
| 2006/0202864 A1 | 9/2006 | Pirschel | |
| 2007/0165835 A1* | 7/2007 | Berkman | 379/399.01 |
| 2007/0200553 A1 | 8/2007 | Morrison | |
| 2007/0252722 A1* | 11/2007 | Zigdon et al. | 340/870.03 |
| 2008/0051036 A1* | 2/2008 | Vaswani et al. | 455/69 |
| 2008/0052253 A1* | 2/2008 | Edwards et al. | 705/412 |
| 2008/0074284 A1 | 3/2008 | Edwards et al. | |
| 2008/0074289 A1 | 3/2008 | Sauder et al. | |
| 2008/0143493 A1* | 6/2008 | Nam et al. | 340/310.11 |
| 2008/0191897 A1 | 8/2008 | McCollough | |
| 2009/0135836 A1* | 5/2009 | Veillette | 370/400 |
| 2009/0153357 A1 | 6/2009 | Bushman et al. | |
| 2009/0187284 A1 | 7/2009 | Kreiss et al. | |
| 2009/0271045 A1 | 10/2009 | Savelle et al. | |
| 2009/0303703 A1 | 12/2009 | Kao et al. | |
| 2009/0309749 A1 | 12/2009 | Gilbert et al. | |
| 2009/0312968 A1 | 12/2009 | Phillips | |
| 2010/0141153 A1 | 6/2010 | Recker et al. | |
| 2010/0164386 A1* | 7/2010 | You | 315/129 |
| 2010/0222932 A1* | 9/2010 | O'Connor | 700/284 |
| 2010/0231131 A1 | 9/2010 | Anderson | |
| 2011/0001626 A1* | 1/2011 | Yip et al. | 340/635 |
| 2011/0004764 A1 | 1/2011 | Stuber | |
| 2011/0053492 A1* | 3/2011 | Hochstein | 455/7 |
| 2011/0066297 A1* | 3/2011 | Saberi et al. | 700/287 |
| 2011/0103274 A1 | 5/2011 | Vavik | |

OTHER PUBLICATIONS

Office Action from CA Application No. 2,701,974, Sep. 20, 2012, copy consists of 4 pages.

Office Action from CA Application No. 2,760,380, Dec. 13, 2012, copy consists of 2 pages.

Office Action from CA Application No. 2,701,974, May 10, 2013, copy consists of 2 pages.

EP Examination Report Application No. 09 785 218.0, Jul. 8, 2013, copy consists of 10 pages.

Office Action from CA Application No. 2,762,796, Oct. 31, 2013, copy consists of 2 pages.

* cited by examiner

REMOTE MONITORING AND CONTROL OF LED BASED STREET LIGHTS

CROSS REFERENCE TO RELATED APPLICATIONS

This application is a continuation-in-part of co-pending U.S. patent application Ser. No. 12/431,326, filed on Apr. 28, 2009, which is incorporated herein by reference in its entirety.

FIELD OF THE INVENTION

The present invention is directed to remote monitoring and control of LED based street lights through a communication system employed by an advanced metering infrastructure (AMI) or an advanced meter reading (AMR).

BACKGROUND OF THE INVENTION

A street light is a raised source of light on an edge of a road which is turned on or lit at a certain time every day. The street lights may be high intensity discharge (HID) where sodium (in an excited state) in the case of a high pressure sodium (HPS) lights or a mixture of gases (by passing an electric arc through them) in the case of metal halide (MH) lights are used to produce light. Modern street lights have light-sensitive photocells to turn them on at dusk, turn them off at dawn or activate them automatically in dark weather.

Currently, street lights are inefficient and large amounts of energy are consumed to power the street lights. In addition, street lights are not monitored or controlled remotely. For example, a central office cannot monitor power consumption of street lights or diagnose a street light that fails.

SUMMARY OF THE INVENTION

The present disclosure is directed to a method for remotely collecting metering information via a light emitting diode (LED) based street light. In one embodiment, the method comprises collecting information from a utility meter coupled to a home, establishing a two-way communication path via a communication module to a central office, wherein the communication module is coupled to the LED based street light and sending the information from the utility meter to the central office via the two-way communication path.

The present disclosure is also directed to a method for extending a mesh via a light emitting diode (LED) based street light. The method comprises collecting information from a plurality of utility meters in a mesh, receiving the information at a first LED based street light having a communication module and forwarding the information from the first LED based street light via the communication module to a take-off point LED based street light having a communication module that has established a two-way communication path to a central office via one or more intermediate LED based street lights each having a respective communication module.

The present disclosure provides another embodiment of a method for extending a mesh via a light emitting diode (LED) based street light. The method comprises collecting a first information from a plurality of utility meters in a first mesh, receiving the first information at a first LED based street light having a first communication module, forwarding the first information to a second LED based street light having a second communication module, collecting a second information from a plurality of utility meters in a second mesh, combining the first information and the second information and forwarding the first information and the second information from the second LED based street light via the second communication module to a take-off point LED based street light having a communication module that has established a two-way communication path to a central office.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention allow a light emitting diode (LED) based street light to be monitored and controlled remotely. For example, a central office of a utility company may monitor the LED based street lights individually or in groups of LED based street lights and also control the LED based street lights individually or in groups.

In addition, embodiments of the present invention may utilize existing infrastructures. As a result, completely new infrastructures do not need to be built to implement the present invention. Rather, the present invention allows a communication module that is compatible with an existing infrastructure to be coupled to or integrated with the LED based street lights such that the present invention is "plug and play". In other words, a utility company may take advantage of the currently used communication infrastructure to deploy the ability to monitor and control one or more LED based street lights.

One example of an existing infrastructure is an advanced metering infrastructure (AMI) used by utility companies across North America. The present invention may take advantage of the systems and communications networks already in place in the AMI. This provides a low capital investment to deploy the present invention.

Figure 1:
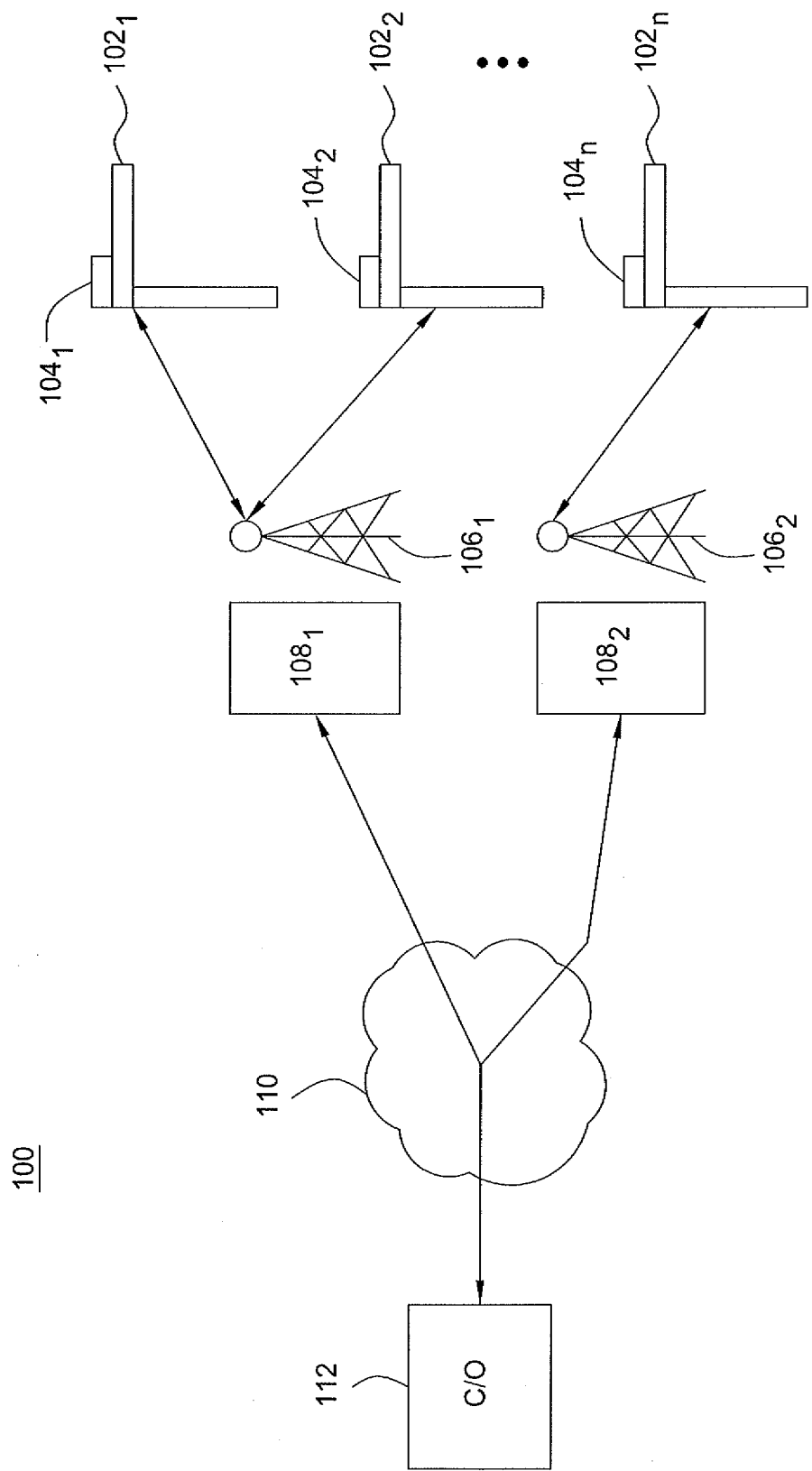
FIG. 1 depicts one embodiment of an architecture for remote monitoring and controlling of LED based street lights.

FIG. 1 illustrates one embodiment of an architecture 100 for remotely monitoring and controlling at least one LED based street light. The architecture 100 includes one or more LED based street lights $102_1$, $102_2$ to $102_n$ (herein collectively referred to as LED based street lights 102 or a LED based street light 102). Although only three LED based street lights 102 are illustrated in FIG. 1, those skilled in the art will recognize that the architecture 100 may include any number of LED based street lights 102.

The LED based street lights 102 may include one or more individual LEDs. In addition, one or more groups of LEDs may be organized within the LED based street lights 102. For example, each one of the one or more groups of LEDs may be utilized to illuminate a different area and may be independently controllable.

Each one of the LED based street lights $102_1$, $102_2$ to $102_n$ may be coupled to (e.g. in communication with) a communication module $104_1$, $104_2$ to $104_n$, respectively (herein collectively referred to as communication modules 104 or a communication module 104). In one embodiment, the communication module 104 may be integrated with the LED based street lights 102. For example, the LED based street lights 102 and integrated communication module 104 may come as a single integrated unit.

The communication module 104 may be any communication module that is compatible with the communication protocols used by the architecture 100. For example, if a paging communication protocol is used, the communication module 104 may be a Reflex Modem designed and manufactured by Dialight Corporation of South Farmingdale, N.J. However, those skilled in the art will recognize that any communication module 104 may be used.

In one embodiment, the communication module 104 may communicate via at least one of a 900 megahertz (MHz) spread spectrum band, a ZigBee protocol, a power line communication protocol, a cellular protocol, a satellite communication protocol, a paging communication protocol or any combination thereof. The communication protocol used by the communication module 104 will be dependent upon the communication protocol used by the underlying communication network.

For example, the architecture 100 may include one or more communication towers $106_1$ and $106_2$ and one or more gateways $108_1$ and $108_2$. Although only two communication towers 106 and two gateways 108 are illustrated in FIG. 1, those skilled in the art will recognize that any number of communication towers 106 and gateways 108 may be used.

In one embodiment, the communication towers 106 and the gateways 108 may be deployed by the utility company or AMI network service provider. For example, the communication towers 106 may be wide range communication towers that use a licensed two-way communication path between the communication towers 106 and the LED based street lights 102. The two-way communication path may use a 900 megahertz (MHz) spread spectrum protocol. Accordingly, the communication modules 104 may be a 900 MHz modem.

In another embodiment, the communication towers 106 may be a third party paging tower serviced by a telecommunications service provider. Thus, the two-way communications path may use a paging communications protocol, such as for example, ReFlex communications protocol. Accordingly, the communication module 104 may be a ReFlex modem.

The gateways 108 may communicate with a central office 112 via a public network 110. For example, the public network 110 may be an Internet Protocol (IP) network or a Cellular network, for example Global System for Mobile communications and General Packet Radio Service (GSM/CPRS) or Cell Division Multiple Access (CDMA). Thus, a two-way communications path may be established between the central office 112 and the LED based street lights 102.

Using the two-way communications path, the LED based street lights 102 may send information related to the LED based street lights 102 to the central office 112. In other words, the central office 112 may remotely monitor the LED based street lights 102. In addition, the central office 112 may send control signals to any one of the LED based street lights 102. In other words, the central office 112 may remotely control the LED based street lights 102. Notably, the central office 112 may remotely monitor and control individual LED based street lights 102, one or more groups of LEDs within a single LED based street light 102 or groups of LED based street lights 102.

The information related to the LED based street lights 102 may include report information or diagnostic information. In one embodiment, report information may include a burn time, a fault with a time-stamp, a number of ignitions, an amount of kilo-watt hours (KWH) usage, a number of functioning LEDs within the LED based street light 102, a light output factor of the LED based street light 102 or a light degradation factor of the LED based street light 102. In one embodiment, the diagnostic information may include a fixture malfunction or a photo controller failure.

The control signal may include a signal to turn on the LED based street light 102, turn off the LED based street light 102, adjust a brightness level of the LED based street light 102 or request an on demand health check of the LED based street light 102. For example, the control signal may be used to dim the LED based street light 102 if the central office 112 determines that a street illuminated by one or more particular LED based street lights 102 is not being used (e.g. no traffic on the street).

As discussed above, the LED based street light 102 may include one or more independently controllable groups of LEDs. The control signal may include a signal to control one of the independently controllable groups of LEDs as well. For example, the control signal may only turn on one group of LEDs, while leaving off other groups of LEDs within a single LED based street light 102.

Thus, the central office 112 may collect information related to each one of the LED based street lights 102 and control each one of the LED based street lights 102. As a result, the central office 112 may be able to maximize the efficiency of the LED based street lights 102, reducing energy usage and overall cost to operate the LED based street lights 102.

Figure 2:
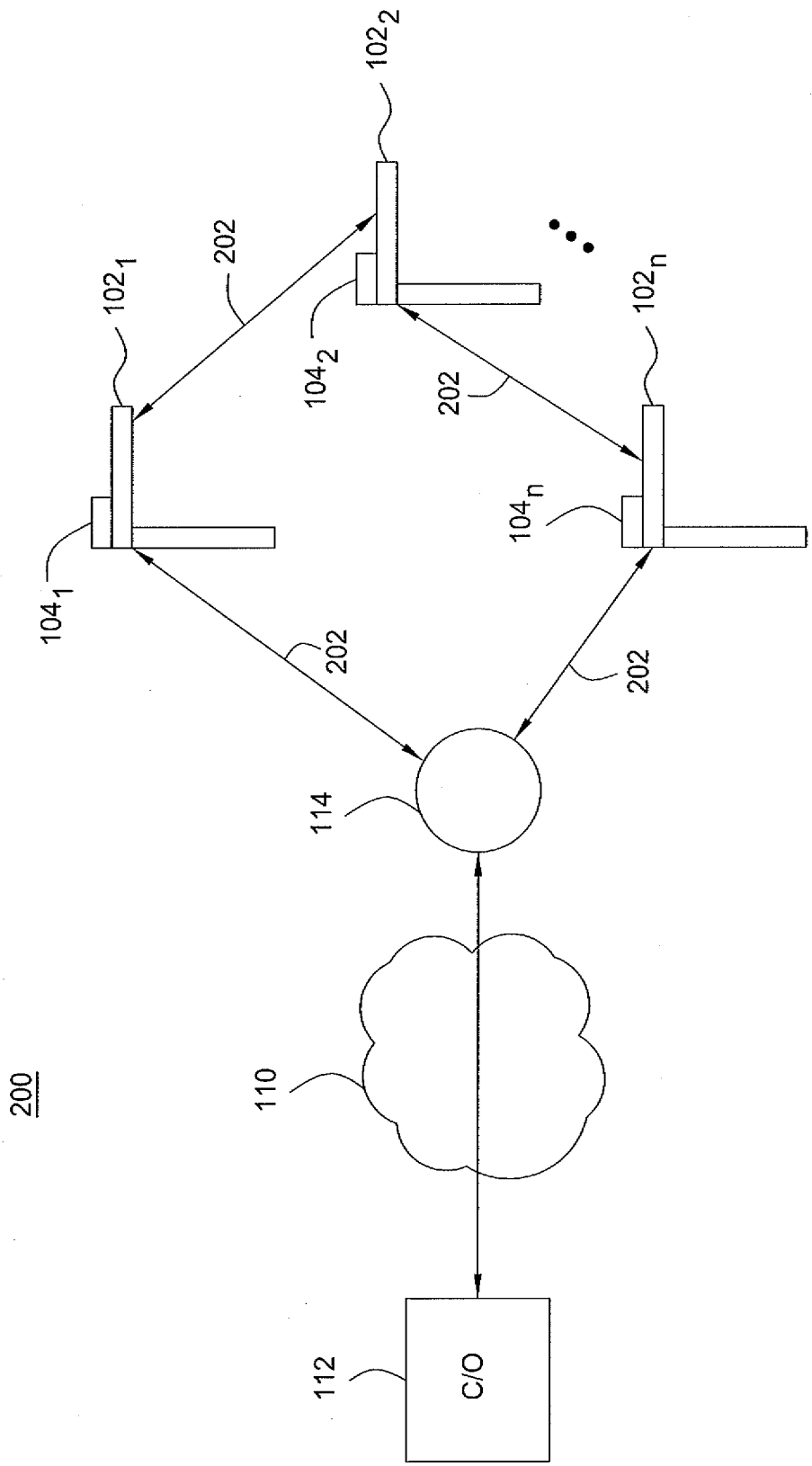
FIG. 2 depicts one embodiment of an architecture for remote monitoring and controlling of LED based street lights using peer-to-peer communications.

FIG. 2 illustrates one embodiment of an architecture 200 for remote monitoring and controlling of LED based street lights 102 using peer-to-peer communications. The architecture 200 includes one or more LED based street lights 102, similar in all respects to the LED based street lights 102 described with respect to FIG. 1 above.

Each one of the LED based street lights $102_1$, $102_2$ to $102_n$ may be coupled to a communication module $104_1$, $104_2$ to $104_n$. The communication modules 104 are similar in all respects to the communication modules 104 described above with respect to FIG. 1 above.

The architecture 200 includes a meter collector 114, the public network 110 and the central office 112. The public network 110 and the central office 112 are similar in all respects to the public network 110 and the central office 112 described above with respect to FIG. 1.

Notably, in FIG. 2, each one of the LED based street lights 102 may communicate with one another as illustrated by arrows 202. For example, information related to the LED based street light $102_1$ may be collected by the communication module $104_1$ and passed on to communication module $104_2$. Information related to the LED based street light $102_2$ may be collected by the communication module $104_2$ and compiled with the information related to the LED based street light $102_1$ and passed on to communication module $104_n$ and so forth.

Eventually, all the information relating to each one of the LED based street lights 102 are forwarded to the meter collector 114. The meter collector 114 may then forward the information over the public network 110 to the central office 112.

Similar to FIG. 1, the central office 112 may also send control signals over the public network 110 back to the meter collector 114. The meter collector 114 may then forward the control signal to the appropriate LED based street light 102 using the peer-to-peer communications.

Figure 3:
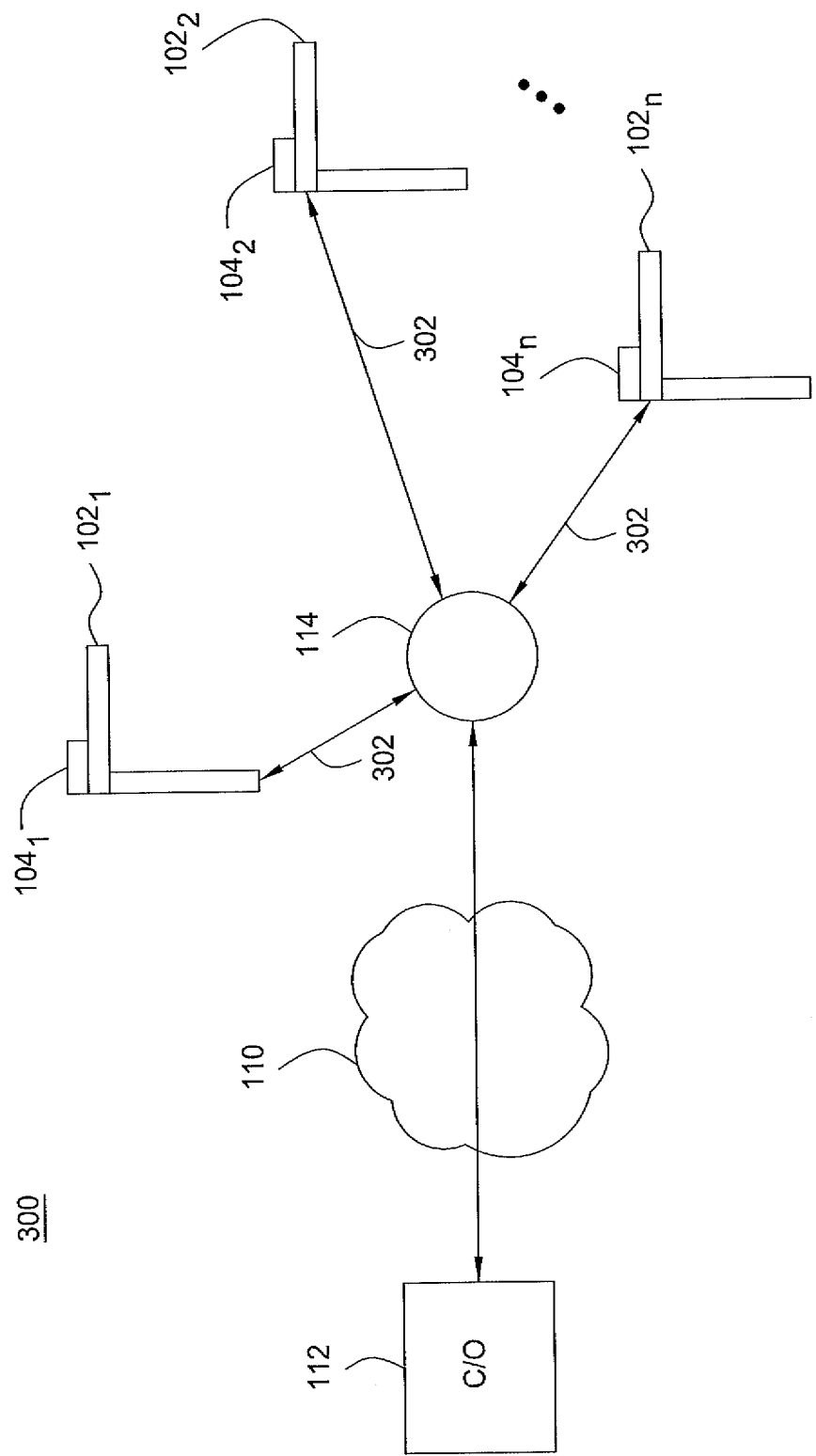
FIG. 3 depicts one embodiment of an architecture for remote monitoring and controlling of LED based street lights using a local meter collector.

FIG. 3 illustrates one embodiment of an architecture 300 for remote monitoring and controlling of LED based street lights 102 using direct communications to a local meter collector. The architecture 300 includes one or more LED based street lights 102, similar in all respects to the LED based street lights 102 described with respect to FIG. 1 above.

Each one of the LED based street lights $102_1$, $102_2$ to $102_n$ may be coupled to a communication module $104_1$, $104_2$ to $104_n$. The communication modules 104 are similar in all respects to the communication modules 104 described above with respect to FIG. 1 above.

The architecture 300 includes a meter collector 114, the public network 110 and the central office 112. The public network 110 and the central office 112 are similar in all respects to the public network 110 and the central office 112 described above with respect to FIG. 1.

Notably, in FIG. 3, each one of the LED based street lights 102 may communicate directly with the meter collector 114 as illustrated by arrows 302. For example, information related to the LED based street light $102_1$ may be communicated directly to the meter collector 114 by the communication module $104_1$. Information related to the LED based street light $102_2$ may be communicated directly to the meter collector 114 by the communication module $104_2$ and so forth.

Eventually, all the information relating to each one of the LED based street lights 102 are forwarded to the meter collector 114. The meter collector 114 may then forward the information over the public network 110 to the central office 112.

Similar to FIG. 1, the central office 112 may also send control signals over the public network 110 back to the meter collector 114. The meter collector 114 may then forward the control signal to the appropriate LED based street light 102 using the direct communications.

In one embodiment, the peer-to-peer architecture 200 and the direct communications architecture 300 may be used to collect information locally on a street via the meter collector 114. Then one or more meter collectors 114 may transmit the collected information over longer distances to the central office 112 via the public network 110.

Figure 4:
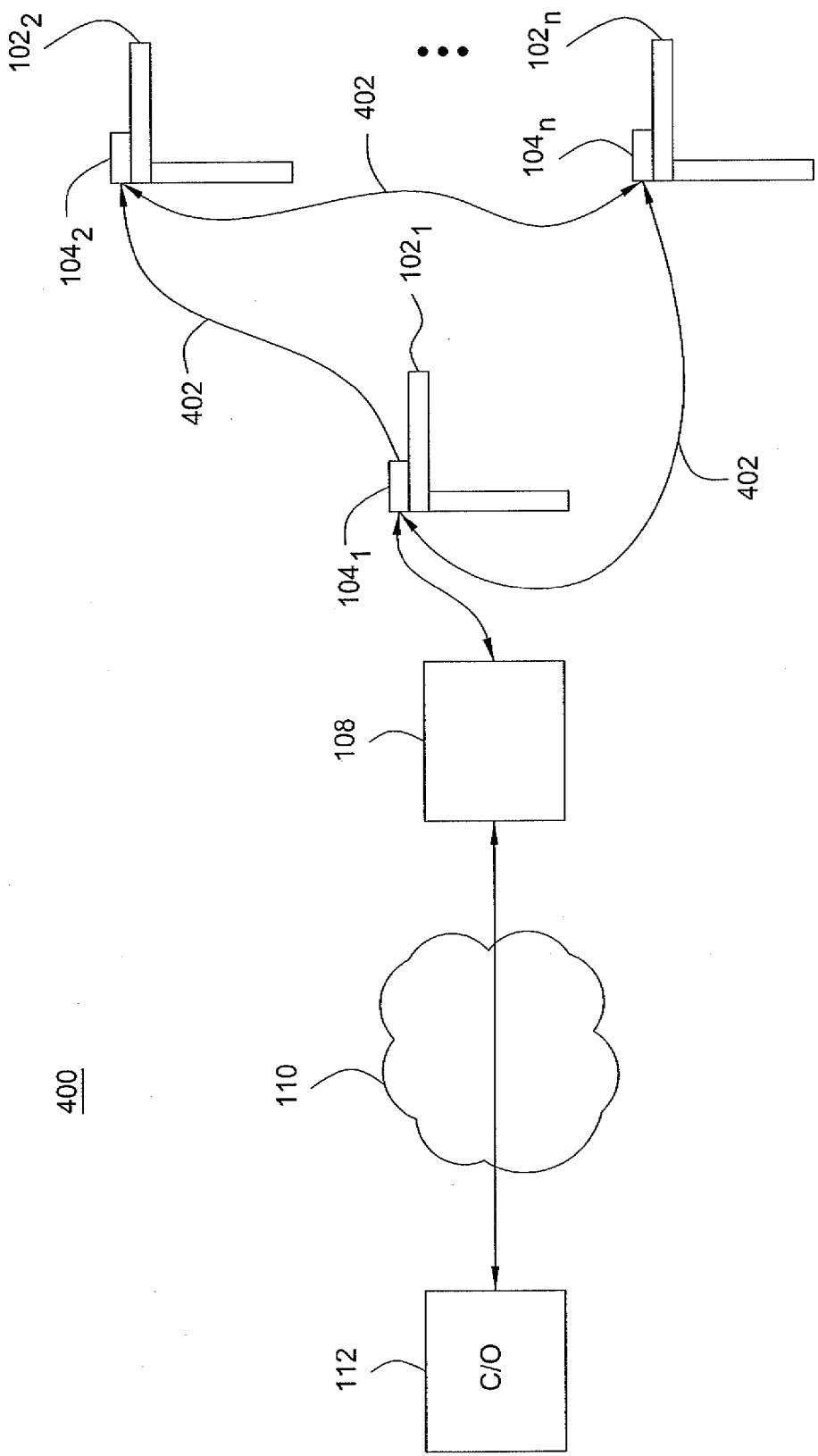
FIG. 4 depicts one embodiment of an architecture for remote monitoring and controlling of LED based street lights using power line modems (PLM)

FIG. 4 illustrates one embodiment of an architecture 400 for remote monitoring and controlling of LED based street lights 102 using power line modems (PLM). The architecture 400 includes one or more LED based street lights 102, similar in all respects to the LED based street lights 102 described with respect to FIG. 1 above.

Each one of the LED based street lights $102_1$, $102_2$ to $102_n$ may be coupled to a communication module $104_1$, $104_2$ to $104_n$. The communication modules 104 in FIG. 4 may comprise a PLM for wired communications.

The architecture 400 includes the gateway 108, the public network 110 and the central office 112. The gateway 108, the public network 110 and the central office 112 are similar in all respects to the gateway 108, the public network 110 and the central office 112 described above with respect to FIG. 1.

Notably, in FIG. 4, each one of the LED based street lights 102 may communicate with one another as illustrated by arrows 402. For example, information related to the LED based street light $102_1$ may be collected by the communication module $104_1$ (e.g., a PLM) and passed on to communication module $104_2$ (e.g., a PLM). Information related to the LED based street light $102_2$ may be collected by the communication module $104_2$ (e.g., a PLM) and compiled with the information related to the LED based street light $102_1$ and passed on to communication module $104_n$ (a PLM) and so forth.

Eventually, all the information relating to each one of the LED based street lights 102 are forwarded to a PLM in communications with the gateway 108. The gateway 108 collects the information and then may forward the information over the public network 110 to the central office 112.

Similar to FIG. 1, the central office 112 may also send control signals over the public network 110 back to the gateway 108. The gateway 108 may then forward the control signal to the appropriate LED based street light 102 using the PLM communications protocol.

FIG. 4 may also include a meter collector (not shown) for collecting information from utility meters coupled to homes. In one embodiment, the meter collector may also communicate with the PLMs to provide information related to the homes. Thus, the PLMs may forward utility information related to the homes along with the information related to the LED based street lights 102 to the central office 112 via the gateway 108 and the public network 110. Any configuration of the LED based street lights 102 illustrated in FIGS. 1-4 may be used to collect and forward the information from utility meters coupled to homes in addition to the information related to the LED based street lights 102.

Figure 5:
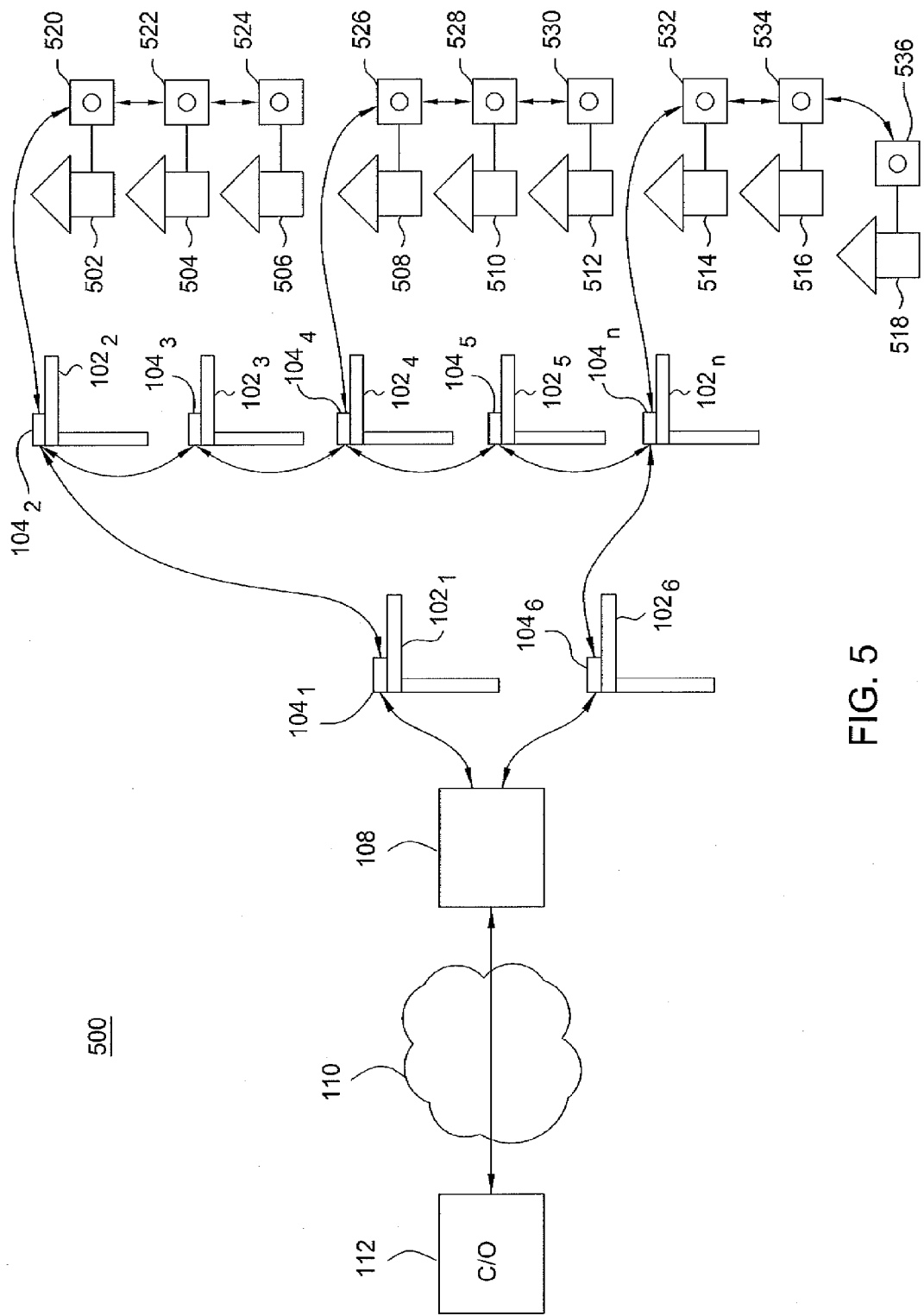
FIG. 5 depicts one embodiment of an architecture for extending a mesh.

FIG. 5 illustrates one embodiment of an architecture 500 for extending a mesh. In one embodiment, a mesh may be defined as a neighborhood area network (NAN) or a local metering mesh of homes. For example, a first mesh may include utility meters 520, 522 and 524 coupled to homes 502, 504 and 506, respectively. A second mesh may include utility meters 526, 528 and 530 coupled to homes 508, 510 and 512, respectively. A third mesh may include utility meters 532, 534 and 536 coupled to homes 514, 516 and 518, respectively. It should be noted that although three meshes are shown, any number of meshes may be included and the number of meshes shown should not be limiting.

In addition, it should be noted that any number of homes and utility meters may be included in a mesh. Although FIG. 5 illustrates three homes and utility meters per mesh as an example, the number of homes and utility meters per mesh illustrated in FIG. 5 should not be considered limiting. For example, each home may have a plurality of utility meters, e.g., a gas meter, an electric meter and the like. As a result, information from the plurality of utility meters for a home may be collected. Moreover, each mesh may include a different number of homes and utility meters. In other words, each mesh does not require an identical number of homes and utility meters.

In one embodiment, the first mesh, the second mesh and the third mesh may be in geographically different locations. For example, the first mesh may be located in town A, the second mesh may be located in town B and the third mesh may be located in town C. Towns A, B and C may be located in the same state or different states.

Previously, if a utility company wanted to collect utility information from the first mesh, the second mesh and the third mesh, the information would have to be collected manually. For example, an employee would be required to travel to the utility meter and collect the information by hand.

Alternatively, the utility company could try to build their own wide area network (WAN). However, to build their own WAN would require a large capital investment. For example, the utility company would have to deploy routers at each one of the locations of the first mesh, the second mesh and the third mesh. In addition, the utility company would have to find and buy land to deploy the routers. Finally, the utility company would have to pay for manpower to install the routers.

One embodiment of the present disclosure uses the LED based street lights 102 to extend the mesh for utility companies. For example, the communication module 104 on the LED based street lights 102 may be used as a router to collect and forward the utility information from the first mesh, the second mesh and the third mesh without requiring the utility company to invest a substantial amount of their capital in buying land, buying routers and installing/deploying the routers on the land.

For example, one or more LED based street lights $102_1$ to $102_n$ may be deployed from town to town and/or state to state. Each one of the LED based street lights $102_1$ to $102_n$ may have a communication module $104_1$ to $104_n$, respectively. In one embodiment, additional LED based street lights 102 without a communication module 104 may be placed between the LED based street lights $102_1$ to $102_n$. In other words, all LED based street lights 102 do not need to have a communication module 104.

Some of the LED based street lights $102_1$ to $102_n$ may be considered a take-off point LED based street light. A take-off point LED based street light may be defined as an LED based street light 102 that has access to or is in communication with the WAN via the gateway 108. For example, LED based street lights $102_1$ and $102_6$ may be considered a take-off point LED based street lights.

In one embodiment, the first mesh, the second mesh and the third mesh, can transmit or send utility meter information from the utility meters 520-536 to their respective LED based street light 102 that is within a transmission and/or a reception range (e.g., either wirelessly or wired). As discussed above, the utility meters 520-536 may be equipped with a wireless transmitter or connected via a PLM serving as the communication modules 104 to send the utility meter information. For example, the communication module $104_2$ of the LED based street light $102_2$ is within range of the first mesh, the communication module $104_4$ of the LED based street light $102_4$ is within range of the second mesh and the communication module $104_n$ of the LED based street light $102_n$ is within range of the third mesh. It should be noted that since the LED based street lights 102 are geographically dispersed in different locations away from one another, the first mesh and second mesh are not within range of the communication module $104_n$ of the LED based street light $102_n$, the second mesh and the third mesh are not within range of the communication module $104_2$ of the LED based street light $102_2$ and so forth.

As a result, the utility meter information may be forwarded along a series of communication modules 104 of the LED based street lights 102 to a take-off point LED based street light and sent to the utility company. For example, the second mesh may send their utility information to the communication module $104_4$. The utility information may then be sent to communication module $104_3$ and then forwarded to communication module $104_2$. At the communication module $104_2$ the utility information of the first mesh may be collected and combined with the utility information from the second mesh. The combined utility information may then be forwarded to the communication module $104_1$ of the take-off point LED based street light $102_1$. Then the communication module $104_1$ may transmit the combined utility information of the first mesh and the second mesh to a utility company or central office 112 via a two-communication path through the gateway 108 and the public network 110 as discussed above with reference to FIGS. 1-4.

In addition, the utility company may use the communication modules 104 to send control signals to the utility meters 520-536, similar to the way control signals may be sent to the LED based street lights 102. For example, the utility company may send a signal to stop the utility meter 520 via a signal from the central office 112 to the communication module $104_2$ of the first mesh.

As a result, the LED based street lights 102 having a communication module 104 becomes part of the advanced metering infrastructure (AMI). Using the LED based street lights 102 having the communication module 104 allows utility companies to extend the mesh without having to deploy large amounts of capital to build their own WAN to collect utility information.

Figure 6:
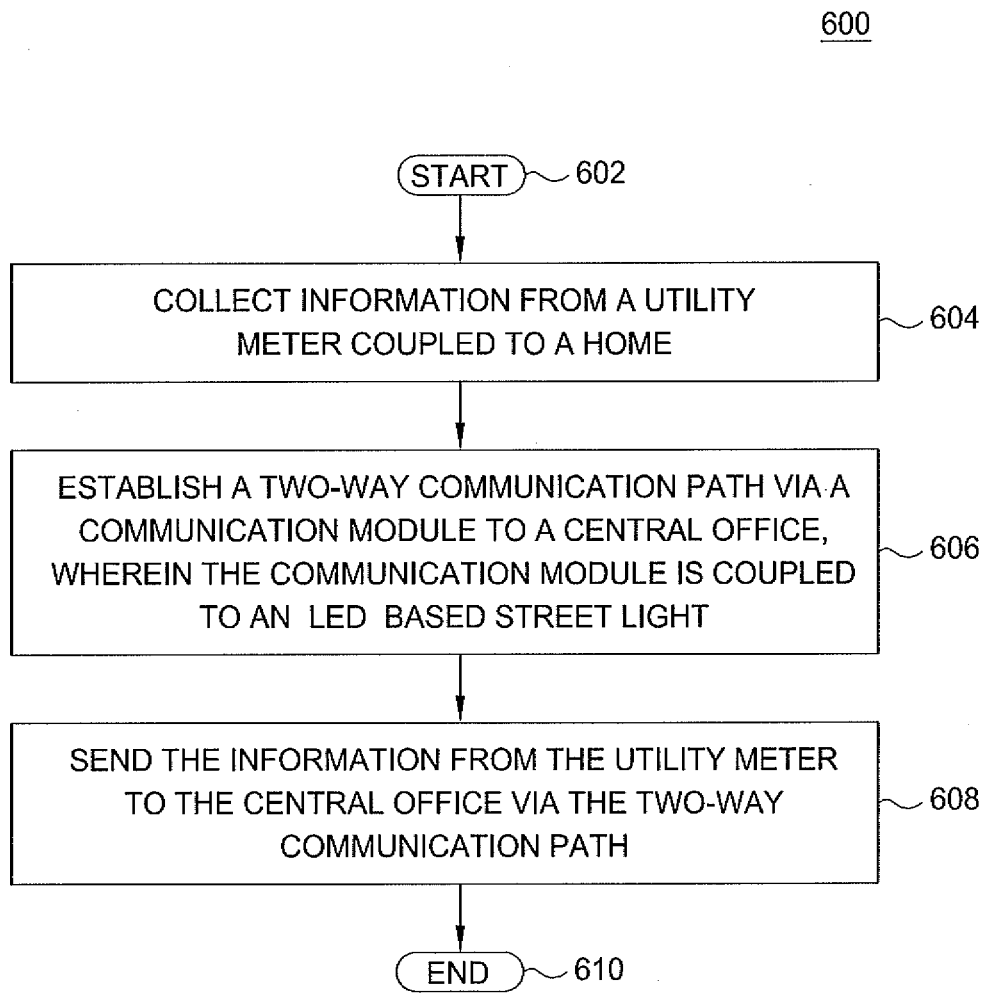
FIG. 6 depicts a flow chart for one embodiment of a method for remotely collecting metering information via the LED based street lights.

FIG. 6 illustrates one embodiment of a flow chart for a method 600 for remotely collecting metering information via the LED based street lights. In one embodiment, the method 600 may be carried out by a communication module 104 coupled to a LED based street lights 102, as described above.

The method 600 begins at step 602. At step 604, the method 600 collects information from a utility meter coupled to a home. In one embodiment, the information may include utility information from the utility meter, such as for example, amount of utility use (e.g., gas, electricity, and the like), current meter readings, and the like. In one embodiment, the information may be sent wirelessly to a communication module 104 of the LED based street light 102. In another embodiment, the communication module 104 may be a PLM and the information may be sent to the PLM via a wired connection.

At step 606, the method 600 establishes a two-way communication path via a communication module to a central office, wherein the communication module is coupled to an LED based street light. The communication module may be any one of the communication modules described above. For example, information from the LED based street light, the utility meter coupled to the home and control signals from the central office may be exchanged in both directions via the two-way communications path.

At step 608, the method 600 sends information from the utility meter to the central office via the two-way communication path. The method 600 ends at step 610.

Figure 7:
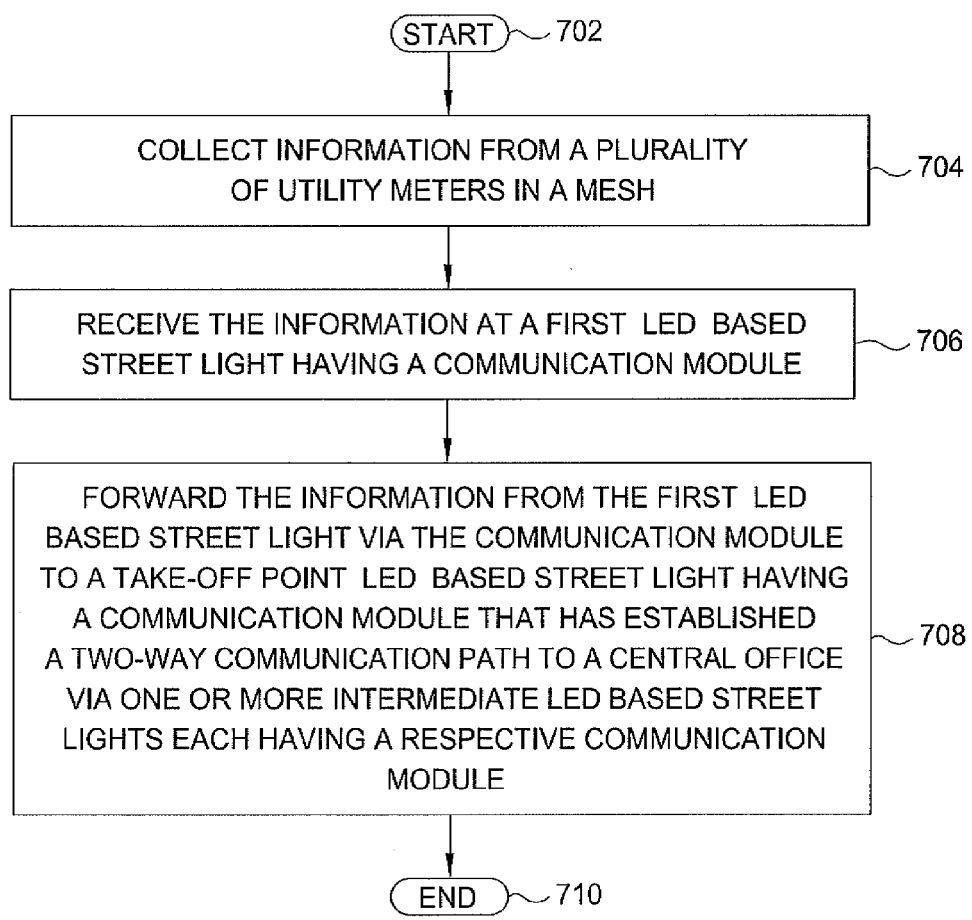
FIG. 7 depicts a flow chart for an embodiment of a method for extending the mesh via the LED based street lights.

FIG. 7 illustrates one embodiment of a flow chart for a method 700 for extending the mesh via the LED based street lights. In one embodiment, the method 700 may be carried out by a communication module 104 coupled to a LED based street lights 102, as described above.

The method 700 begins at step 702. At step 704, the method 700 collects information from a plurality of utility meters in a mesh. In one embodiment, the information may include utility information from the utility meter, such as for example, amount of utility use (e.g., gas, electricity, and the like), current meter readings, and the like.

In one embodiment, the information may also include meter information from each one of the plurality of utility meters in the mesh. As discussed above, the mesh may be defined as a NAN comprising a plurality of homes or a local metering mesh of homes.

In one embodiment, the information may be sent wirelessly to a communication module 104 of the LED based street light 102. In another embodiment, the communication module 104 may be a PLM and the information may be sent to the PLM via a wired connection.

At step 706, the method 700 receives the information at a first LED based street light having a communication module. For example, the first LED based street light is within transmission and/or a reception range (e.g., either wirelessly or wired range) of the utility meters in the mesh.

At step 708, the method 700 forwards the information from the first LED based street light via the communication module to a take-off point LED based street light having a communication module that has established a two-way communication path to a central office via one or more intermediate LED based street lights each having a respective communication module. In one embodiment, the take-off point LED based street light may be defined as a LED based street light having a communication module that is in communication with a WAN. For example, the WAN may include the gateway 108 and the public network 110.

In one embodiment, the first LED based street light, the take-off point LED based street light and the one or more intermediate LED based street lights are located in different locations. In other words, they are geographically remote from one another. For example, the first LED based street light may be in town A, the one or more intermediate LED based street lights may be located in towns B, C and D and the take-off point LED based street light may be located in town E. The method 700 ends at step 710.

Figure 8:
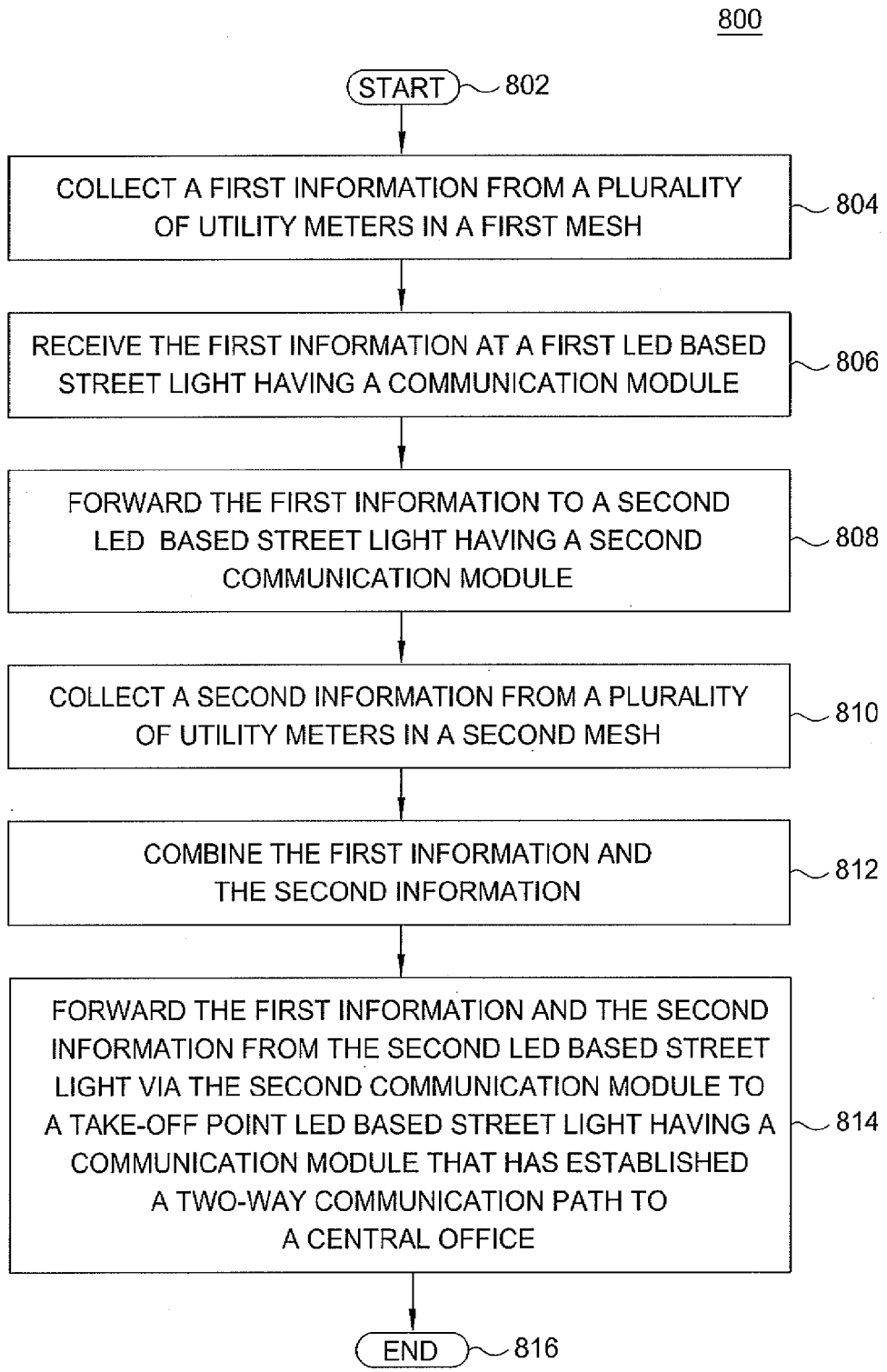
FIG. 8 depicts a flow chart for another embodiment of a method for extending the mesh via the LED based street lights.

FIG. 8 illustrates one embodiment of a flow chart for a method 800 for remotely monitoring and controlling the LED based street light. In one embodiment, the method 800 may be carried out by a communication module 104 coupled to a LED based street light 102, as described above.

The method 800 begins at step 802. At step 804, the method 800 collects a first information from a plurality of utility meters in a first mesh. In one embodiment, the first information may include utility information from the utility meter, such as for example, amount of utility use (e.g., gas, electricity, and the like), current meter readings, and the like.

In one embodiment, the first information may also include meter information from each one of the plurality of utility meters in the first mesh. As discussed above, the mesh may be defined as a NAN comprising a plurality of homes or a local metering mesh of homes.

In one embodiment, the first information may be sent wirelessly to a communication module 104 of the LED based street light 102. In another embodiment, the communication module 104 may be a PLM and the information may be sent to the PLM via a wired connection.

At step 806, the method 800 receives the first information at a first LED based street light having a first communication module.

At step 808, the method 800 forwards the first information to a second LED based street light having a second communication module.

At step 810, the method 800 collects a second information from a plurality of utility meters in a second mesh. In one embodiment, the second information may include utility information from the utility meter, such as for example, amount of utility use (e.g., gas, electricity, and the like), current meter readings, and the like. In one embodiment, the second information may also include meter information from each one of the plurality of utility meters in the second mesh.

In one embodiment, the second information may be sent wirelessly to a communication module 104 of the LED based street light 102. In another embodiment, the communication module 104 may be a PLM and the information may be sent to the PLM via a wired connection.

At step 812, the method 800 combines the first information and the second information. For example, the first information and the second information may be stored together in memory, combined together in one or more packets of information that are transmitted, combined together in a report that is transmitted and the like. In other words, the first information and the second information may be combined such that they are transmitted together.

At step 814, the method 800 forwards the first information and the second information from the second LED based street light via the second communication module to a take-off point LED based street light having a communication module that has established a two-way communication path to a central office. In one embodiment, the take-off point LED based street light may be defined as a LED based street light having a communication module that is in communication with a WAN. For example, the WAN may include the gateway 108 and the public network 110.

In one embodiment, the first LED based street light, the second LED based street light and the take-off point LED based street light are located in different locations. In other words, they are geographically remote from one another. For example, the first LED based street light may be in town A, the second LED based street lights may be located in town B and the take-off point LED based street light may be located in town C. The method 800 ends at step 816.

While various embodiments have been described above, it should be understood that they have been presented by way of example only, and not limitation. Thus, the breadth and scope of a preferred embodiment should not be limited by any of the above-described embodiments, but should be defined only in accordance with the following claims and their equivalents.

What is claimed is:

1. A method for remotely collecting information via a light emitting diode (LED) based street light, comprising:

collecting the information via the LED based street light from a utility meter coupled to a home,
wherein the LED based street light is a part of an Advanced Metering Infrastructure (AMI);
establishing a two-way communication path via a communication module to a central office,
wherein the communication module is coupled to the LED based street light, and
wherein the LED based street light comprises a plurality of independently controllable groups of LEDs;
sending the information from the utility meter to the central office via the two-way communication path,
wherein said two-way communication path traverses the AMI;
receiving, at the communication module, at least one a first control signal from the central office to control the utility meter and a second control signal to control the LED based street light,
wherein the at least one first control signal turns off the utility meter and the second control signal turns on only a subset of the plurality of independently controllable groups of LEDs; and
sending, by the communication module, the first control signal to the utility meter to turn off the utility meter.

2. The method of claim 1, wherein the information from the utility meter is collected by a power line module (PLM).

3. The method of claim 1, wherein the collecting comprises:
   receiving the information from the utility meter at a first LED based street light located near the home; and
   forwarding the information from the utility meter from the first LED based street light to one or more additional LED based street lights until the information reaches the LED based street light that has established the two-way communication path via the communication module to the central office.

4. The method of claim 1, wherein the collecting comprises collecting information from a plurality of utility meters coupled to each one of a plurality of homes.

5. The method of claim 1, wherein said communication module communicates via at least one of: a 900 megahertz (MHz) spread spectrum band, a ZigBee protocol, a power line communication protocol, a cellular protocol, a satellite communication protocol, a paging communication protocol or any combination thereof.

6. The method of claim 1, wherein said two-way communication path traverses at least one public network.

7. A method for extending a mesh network, comprising:
   collecting information from a plurality of utility meters in the mesh network;
   receiving the information at a first light emitting diode (LED) based street light having a communication module from the plurality of utility meters in the mesh network,
      wherein the first LED based street light comprises a plurality of independently controllable groups of LEDs, and
      wherein the first LED based street light is a part of an Advanced Metering Infrastructure (AMI);
   forwarding the information from the first LED based street light via the communication module to a take-off point LED based street light having a communication module that has established a two-way communication path to a central office via one or more intermediate LED based street lights each having a respective communication module,
      wherein the take-off point LED based street light collects information from a plurality of different mesh networks to send to the central office,
      wherein one or more of the plurality of different mesh networks do not have a respective take-off point LED based street light, and
      wherein the take-off point LED based street light is a part of the AMI;
   receiving, at the communication module of the first LED based street light, a first control signal from the central office to control one of the plurality of utility meters and a second control signal to control the first LED based street light,
      wherein the first control signal turns off the one of the plurality of utility meters and the second control signal turns on only a subset of the plurality of independently controllable groups of LEDs; and
   sending, by the communication module of the first LED based street light, the first control signal to the one of the plurality of utility meters to turn off the one of the plurality of utility meters.

8. The method of claim 7, wherein the information is collected by a power line module (PLM).

9. The method of claim 7 wherein the mesh network comprises a neighborhood area network (NAN) comprising a plurality of homes.

10. The method of claim 7 wherein the first LED based street light is located within a transmission and a reception range of the plurality of utility meters in the mesh network.

11. The method of claim 7, wherein the one or more intermediate LED based street lights and the take-off point LED based street light are located in different locations relative to the first LED based street light.

12. The method of claim 7, wherein the take-off point LED based street light comprises an LED based street light having a communication module in communication with a wide area network (WAN).

13. The method of claim 7, wherein said communication module communicates via at least one of: a 900 megahertz (MHz) spread spectrum band, a ZigBee protocol, a power line communication protocol, a cellular protocol, a satellite communication protocol, a paging communication protocol or any combination thereof.

14. A method for extending a mesh network, comprising:
   collecting a first information from a plurality of utility meters in a first mesh network,
      wherein the first mesh network does not have a take-off point light emitting diode (LED) based street light in communication with a gateway to access a public communication network;
   receiving the first information at a first LED based street light having a first communication module from the plurality of utility meters in the first mesh network,
      wherein the first LED based street light comprises a plurality of independently controllable groups of LEDs, and
      wherein the first LED based street light is a part of an Advanced Metering Infrastructure (AMI);
   forwarding the first information to a second LED based street light having a second communication module,
      wherein the second LED based street light is a part of the AMI;
   collecting a second information from a plurality of utility meters in a second mesh network;
   combining the first information and the second information;
   forwarding the first information and the second information from the second LED based street light via the second communication module to a take-off point LED based street light having a communication module that has established a two-way communication path to a central office, wherein the take-off point LED based street light is a part of the AMI;
   receiving, at the communication module of the first LED based street light, a first control signal from the central office to control one of the plurality of utility meters and a second control signal to control the first LED based street light,
      wherein the at least one first control signal turns off the one of the plurality of utility meters and the second control signal turns on only a subset of the plurality of independently controllable groups of LEDs; and
   sending, by the communication module of the first LED based street light, the at least one first control signal to the one of the plurality of utility meters to turn off the one of the plurality of utility meters.

15. The method of claim 14, wherein the first information and the second information are collected by a respective power line module (PLM).

16. The method of claim 14 wherein each of the first mesh network and the second mesh network comprises a neighborhood area network (NAN) comprising a plurality of homes.

17. The method of claim 14, wherein the first communication module, the second communication module and the communication module of the take-off point LED based street light communicate via at least one of: a 900 megahertz (MHz) spread spectrum band, a ZigBee protocol, a power line communication protocol, a cellular protocol, a satellite communication protocol, a paging communication protocol or any combination thereof.

18. The method of claim 14, wherein one or more intermediate LED based street lights each having a communication module are located in between a communication path between the first communication module and the second communication module and between the second communication module and the communication module of the take-off point LED based street light.

19. The method of claim 14, wherein the take-off point LED based street light comprises an LED based street light having a communication module in communication with a wide area network (WAN).

\* \* \* \* \*

UNITED STATES PATENT AND TRADEMARK OFFICE
CERTIFICATE OF CORRECTION

| | | |
|---|---|---|
| PATENT NO. | : 8,803,662 B2 | Page 1 of 1 |
| APPLICATION NO. | : 12/984377 | |
| DATED | : August 12, 2014 | |
| INVENTOR(S) | : Rizwan Ahmad | |

It is certified that error appears in the above-identified patent and that said Letters Patent is hereby corrected as shown below:

In the specification

Column 4, line 2, delete "CPRS)" and insert --GPRS--, therefor.

In the claims

Column 10, line 58, In Claim 1, before "a first" delete "at least one", therefor.

Column 10, line 62, In Claim 1, before "first" delete "at least one", therefor.

Column 12, line 22, In Claim 14, before "mesh" insert --first--, therefor.

Signed and Sealed this
Eighth Day of December, 2015

Michelle K. Lee
*Director of the United States Patent and Trademark Office*